United States Patent
Pahl et al.

(10) Patent No.: US 6,984,421 B2
(45) Date of Patent: Jan. 10, 2006

(54) ENCAPSULATION FOR AN ELECTRICAL COMPONENT AND METHOD FOR PRODUCING THE SAME

(75) Inventors: Wolfgang Pahl, München (DE); Walter Fischer, München (DE)

(73) Assignee: EPCOS AG, Munich (DE)

( * ) Notice: Subject to any disclaimer, the term of this patent is extended or adjusted under 35 U.S.C. 154(b) by 314 days.

(21) Appl. No.: 10/203,710

(22) PCT Filed: Feb. 2, 2001

(86) PCT No.: PCT/DE01/00404

§ 371 (c)(1),
(2), (4) Date: Aug. 13, 2002

(87) PCT Pub. No.: WO01/59827

PCT Pub. Date: Aug. 16, 2001

(65) Prior Publication Data

US 2003/0012884 A1 Jan. 16, 2003

(30) Foreign Application Priority Data

Feb. 14, 2000   (DE) .......................................... 100 06 446

(51) Int. Cl.
*B05D 5/00* (2006.01)

(52) U.S. Cl. .................. 427/535; 427/554; 427/558; 427/595; 427/596; 427/58; 427/240; 427/261; 427/264; 427/265; 427/271; 427/352; 427/407.1; 427/425

(58) Field of Classification Search ................ 427/240, 427/425, 261, 264, 265, 271, 58, 554, 558, 427/595, 596, 407.1, 352, 535
See application file for complete search history.

(56) References Cited

U.S. PATENT DOCUMENTS

| | | | | |
|---|---|---|---|---|
| 5,729,185 A | * | 3/1998 | Johnson et al. | 333/193 |
| 5,831,369 A | | 11/1998 | Furbacher et al. | 310/313 R |
| 5,920,142 A | * | 7/1999 | Onishi et al. | 310/313 R |
| 6,136,175 A | * | 10/2000 | Stelzl et al. | 205/220 |
| 6,492,194 B1 | * | 12/2002 | Bureau et al. | 438/106 |

FOREIGN PATENT DOCUMENTS

| | | |
|---|---|---|
| EP | 0 794 616 A2 | 9/1997 |
| EP | 0 805 552 A2 | 11/1997 |
| JP | 2000-165192 A  * | 6/2000 |
| WO | WO 97/45955 | 12/1997 |
| WO | WO 00/00961 | 1/2000 |

* cited by examiner

*Primary Examiner*—Kirsten Jolley
(74) *Attorney, Agent, or Firm*—Fish & Richardson P.C.

(57) ABSTRACT

Encapsulating a component structure includes applying a fluid, light-sensitive first reactive resin layer to a surface of a component substrate containing the component structure, exposing and developing the first reactive resin layer so as to form a frame structure that encloses the component structure, covering the frame structure with an auxiliary foil, applying a second reactive resin layer to a surface of the auxiliary foil so as to form ceiling structures on the surface of the auxiliary foil, at least one of the ceiling structures making a seal with the frame structure, and removing the auxiliary foil in areas between ceiling structures.

16 Claims, 2 Drawing Sheets

ENCAPSULATION FOR AN ELECTRICAL COMPONENT AND METHOD FOR PRODUCING THE SAME

CROSS-REFERENCE TO RELATED APPLICATIONS

This application claims priority to PCT Application No. PCT/DE01/00404, filed on Feb. 2, 2001, and to German Patent Application No. 100 06 449.6, filed on Feb. 14, 2000.

BACKGROUND

In the manufacture of electrical and electronic components from wafers, it is often necessary to provide sensitive component structures with a cover while they are still on the wafer, i.e., prior to their being separated into individual components. This cover can, for one thing, serve as protection against external influences further along in the manufacturing process or can become the foundation for certain packaging technologies. A cover of this type can form a mechanical protection against media introduced further along in the process or as a protection against contamination, in particular against electrically conductive particles, which are particularly disruptive in miniaturized components. The packaging can be completed based on this cover, for example in a resin mold, compressing it in plastic, installing it in another housing, etc.

Surface acoustic wave devices have especially sensitive component structures that can include inter-digital transducers and reflectors in the form of finely structured conduction paths. These sensitive structures are not, in general, permitted to come into contact with the covers noted above, since this contact can cause properties of the surface acoustic wave devices to change in an unreliable and non-reproducible manner. To cover such structures requires an encapsulation that forms a cavity over the structures.

From WO 95/30 276, an encapsulation for electrical and electronic components is known that comprises a frame and a support structure that encloses the component structures and a cover layer that sits on top of them that can form a hermetically sealed cap, together with the frame, that encloses the sensitive structures. It is preferred that both the frame structure as well as the cover layer be made of a photoresist material, and particularly of a photoresist foil. These are laminated over the entire surface, exposed via a mask, and developed. These steps are separately carried out for the frame structure and the cover layer. Overall, the process is relatively intensive and requires a multitude of process steps.

SUMMARY

The object of this invention is thus to provide a process to encapsulate sensitive component structures that is simpler to carry out, yet leads to a secure encapsulation of even sensitive component structures.

Advantageous embodiments of the invention as well as an encapsulation thus produced can be found in the claims.

Advantageous embodiments of the invention as well as an encapsulation thus produced can be found in the claims.

Like the known encapsulation just described, the process according to the invention is based on a two-part encapsulation system, namely a frame structure that encloses the component structures and a ceiling structure that sits on top of it. According to the invention, however, the difference from the known process is that the reactive resin is applied in fluid form both for the frame structures as well as for the ceiling structures, said resin being cured afterward. After the frame structures are established by the exposure and development of a first reactive resin layer, an auxiliary foil is stretched over the entire surface, if necessary over the entire wafer, and not just over the individual component. This foil covers all frame structures produced on the substrate, and adheres to them. The second reactive resin layer is then applied on top of the auxiliary foil in a structured manner. In the last step, the areas of the auxiliary foil outside the frame structures and between the ceiling structures are removed, preferably by dissolving them using a solvent or by treating them with a plasma.

In a preferred embodiment of the invention, a UV-cured reactive resin is used for the second reactive resin layer that is again structurally exposed, developed and cured after being applied to the entire surface.

A special advantage is that it is very simple and controllable to spin coat the fluid reactive resin, and it is easier to execute than the lamination of resist foils. It is also more cost effective overall. The second reactive resin layer provided for the ceiling structure can then be applied in any desired thickness to ensure sufficient mechanical stability for the encapsulation. The application of further layers over this ceiling structure is then not required.

In the process, the image exposure of the first and second reactive resin layer can each be done using a laser, in particular using a UV (ultraviolet) laser. This is advantageous, since the process can be easily adjusted according to varying component structures, eliminating the need to first produce expensive photo masks for the exposure process.

Advantageously, parallel to the manufacture of the frame structures in the first reactive resin layer, other component structures can be produced at the same time. Examples of such structures include damping structures in surface acoustic wave devices. In this case, it is advantageous if the material of the reactive resin layer is matched acoustically, i.e., having a suitable hardness and a suitable modulus of elasticity.

It is preferred to develop the reactive resin layers using a fluid developer. Depending on the resin system used, the fluid developer may be an organic solvent or an aqueous-alkaline solvent.

In another embodiment of the invention, the second structured reactive resin layer is produced by structured printing onto the auxiliary foil in the area over the frame structures and then curing. Suitable structured printing processes include screen printing and stencil printing. Thanks to the auxiliary foil, the printing is not critical even when the structural dimensions of the component structures are small, since it is only necessary to cover the frame structures with the second reactive resin layer. The printing precision of the print process noted above is sufficient for this purpose even if the printing process is not suited for producing the first reactive resin layer.

This auxiliary foil can be a thin plastic foil, and in particular it can be a thin thermoplastic foil. This is advantageous since it allows the auxiliary foil to be easily stretched, producing an even covering over the frame structures. Furthermore, the plastic foil can connect to the frame structures easily, e.g., by adhesion, melting or fusing.

In the process, the material for the plastic foil can be selected such that it can be easily removed. The material may be soluble in a solvent used to remove the plastic foil in the areas between the frame structures that are not for the purposes of encapsulation.

An appropriately thin plastic foil can also be easily removed in plasma, in particular in plasma containing oxygen. In the process, the thickness of the second reactive resin layer is selected to provide sufficient excess to provide for the dissolution that acts on this second reactive resin layer as well during this removal process. Suitable materials for the plastic foil include, e.g., polyamide, PET, or polycarbonate foils. In the process, the thickness of the plastic foil is selected so that on one hand it is as thin as possible, and on the other hand it is sufficiently sturdy so as to support the second reactive resin layer without sagging too much. Usually, foil thicknesses near 1 μm are sufficient. However, thicker foils of up to approximately 20 μm can also be used, as can thinner foils. For example, the foil thickness can be from 0.5 to 5 μm.

The following explains the invention in more detail with the help of representative examples and with the help of nine figures.

This embodiment is directed to the encapsulation of active, and thus sensitive, component structures of a surface acoustic wave device. The explanatory figures are only schematic representations and thus are not to scale.

DETAILED DESCRIPTION

Figure 1:
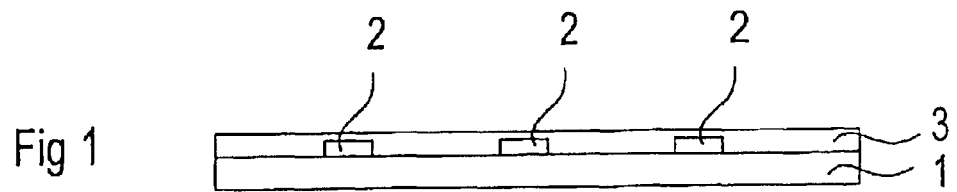
FIGS. 1 through 8 show various process steps to produce the encapsulation of the present invention, shown by schematic cross sections through a component to be encapsulated.

FIG. 1 shows a piezoelectric substrate 1, such as a wafer made of lithium tantalite or lithium niobate. Various component structures are applied to the surface of the substrate 1. Examples of such structures include electrically conducting structures such as an aluminum (e.g., metal) layer. In FIG. 1, only sections of this metal layer are shown, namely the sensitive component structures 2, which can belong to different components although they are located on a single wafer. A light-sensitive reactive resin layer 3 is spun onto the entire surface of the substrate 1 over the component structures. The resin layer 3 may have a thickness of approximately 50 μm. The thickness of the reactive resin layer 3 is selected so that it exceeds the thickness of the component structures 2 to a sufficient extent that a height difference between the top edge of the component structures 2 and the reactive resin layer 3 ensures a safe distance for the cover of the component structures 2.

It is preferred to apply a cationically initiated UV-cured, solvent-free epoxy resin as the reactive resin, cured by UV radiation. This reactive resin contains another photo initiator in addition to the cationically cured epoxy or a photo initiator system that matches the exposure source. These types of epoxy resins are described in DE-A 44 43 946, for example, which is incorporated herein by reference in its entirety. To support curing, the reactive resin can contain additional additives, preferably of a basic nature and selected from the group of salt hydroxides or organic amines.

Figure 2:
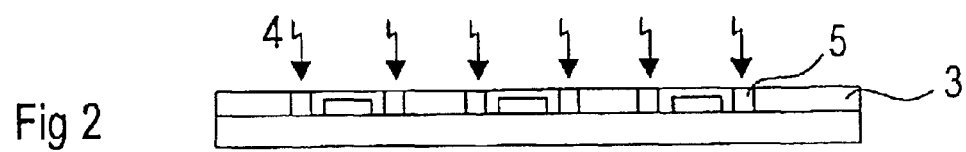

Referring to FIG. 2, through scanned exposure 4 by a UV laser, certain areas 5 in the first reactive resin layer 3 are exposed and at least partially cured. The exposure causes a solubility gradient to occur between the exposed areas 5 and the unexposed areas of the first reactive resin layer 3, allowing the development to be carried out using a developer solution.

Figure 3:
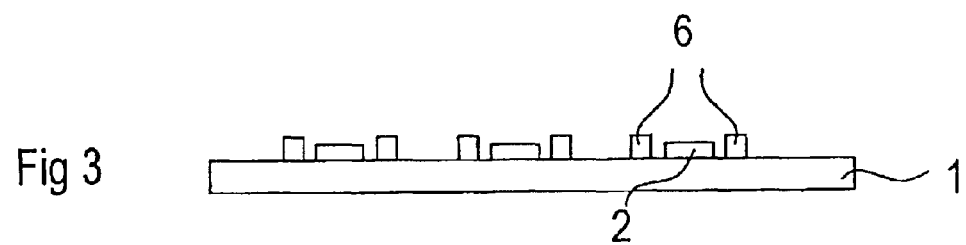

FIG. 3 shows the component after development. The exposed areas 6 of the original first reactive resin layer 3 that remain after development form closed frame structures 6 that enclose the sensitive component structures 2. The frame structures 6, if they are only partially cured, can be completely cured in this process step by increasing the temperature for a short period. The complete cure can also occur prior to development.

A thin plastic foil 7 is thus stretched over the frame structures 6 such that the thin plastic foil sits on top of the frame structures 6. It is preferable to stretch the thin plastic foil 7, which is used as an auxiliary foil, over the entire substrate 1.

Figure 4:
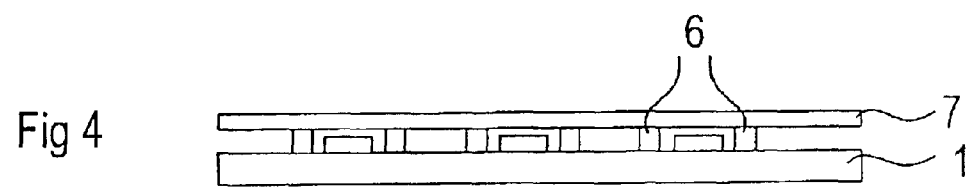

FIG. 4 shows the arrangement resulting after foregoing process step. By heating and layering the foil with adhesive, through laser or frictional fusing or a similar means, the foil 7 is made to stick to the frame structures 6.

Figure 5:
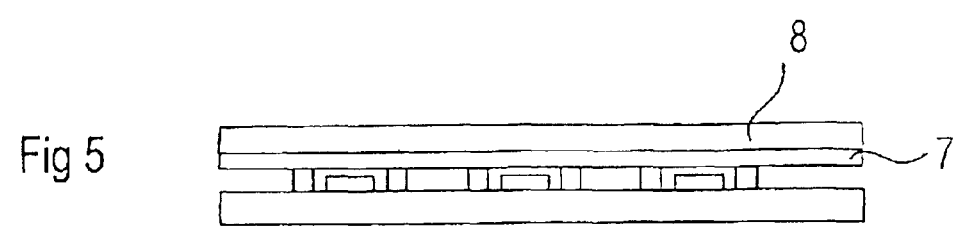

A fluid layer 8 of an equally light-sensitive reactive resin is then spun onto the entire surface of the auxiliary foil 7. Preferably, the same resin as was used for the first reactive resin layer is used here. The thickness of this second reactive resin layer 8 is selected such that it is considerably more than the thickness of the plastic foil 7. FIG. 5 shows the arrangement resulting after this process step.

Figure 6:
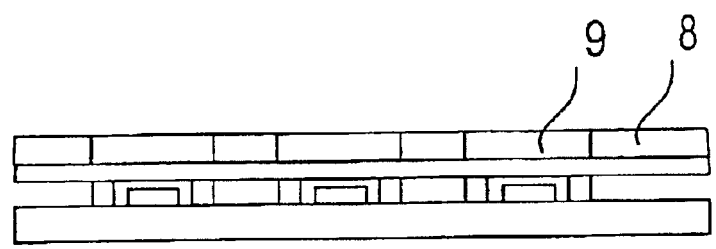

A structured exposure is then performed on the second reactive resin layer 8 to produce cured areas 9. The exposure is carried out in the same manner as the exposure of the first reactive resin layer 3, e.g., by scanned UV laser radiation. The cured areas 9 are arranged such that they form ceiling structures that fit over the frame structures 6, sealing them shut at their outer perimeter (see FIG. 6).

Figure 7:
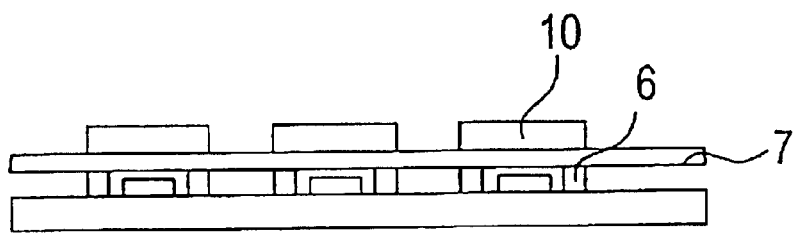

Referring to FIG. 7, if necessary, another temperature varying step is now carried out to complete the curing in areas 9. Then, the unexposed areas of the second reactive resin layer 8 are removed using a fluid developer, leaving the ceiling structures 10 behind. Depending on the resin system used, the developer can be an organic solvent or an aqueous alkaline solvent.

Figure 8:
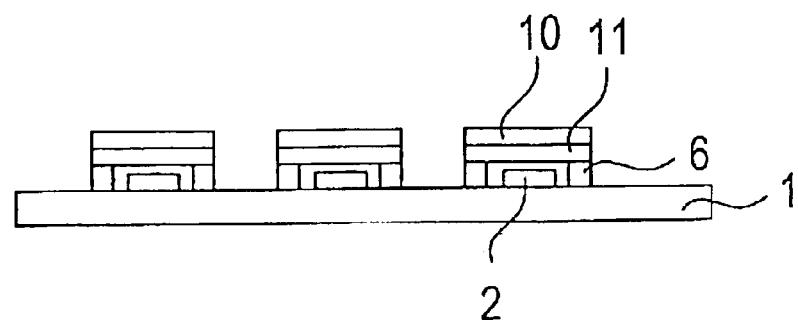

In the next step, the areas of the plastic foil 7 not covered by the ceiling structures 10 are removed, for example, through short-term incineration treatment in suitable plasma, which may contain oxygen. In this etching step, the open, uncovered areas of the plastic foil 7 are completely removed. At the same time, some of the ceiling structure 10 layer is removed. FIG. 8 shows the resulting completely encapsulated component structures 2. The encapsulation includes the frame structure 6 and the ceiling structure 10 with auxiliary foil 11 residue in between. The component structures 2 are thus hermetically sealed and protected against further aggressive process steps. It is also possible to separate the components in this stage by subdividing the substrate 6 between the component structures, i.e., the encapsulated components. The separation can be performed using a saw, for example.

Figure 9:
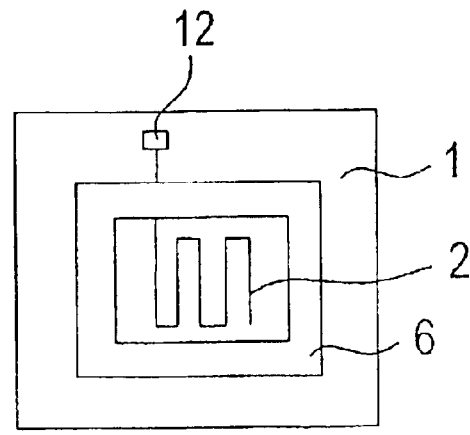
FIG. 9 shows a plan view of the component during a stage in the process.

FIG. 9 shows the arrangement of the frame structures 6 around the sensitive component structures 2. They are shown only schematically. The sensitive component structures can be connected to electrical connecting surfaces 12 on the substrate through conduction paths. The frame structure 6 is then arranged so as to enclose the sensitive component structures 2, but the connection surfaces 12 and, if necessary, part of the electrical leads to it sit outside the frame structure. In the process, part of the electrical lead is covered by the frame structure. After applying the ceiling structures 11, 10, the outer edges of which coincide with the perimeter of the frame structures 6, the electrical connection surfaces 12 remain accessible and can be contacted externally. For example, this can be done using flip chip bonding, in which the connection surfaces 12 are connected to a base plate using so-called bumps. It is, however, also possible to connect to the component via the connection surfaces 12 using bonding wires.

Further processing is preferred to be through flip chip bonding, with the sensitive component structures sitting on the surface of the substrate that faces the base plate, and are thus additionally protected. By sealing the gaps between the substrate 1 and the base plate as well (not shown in the figure), the component can be further sealed.

Although the invention was described by means of one embodiment, it is not limited to that embodiment. To the contrary, it is possible to encapsulate other components with the aid of the invention using other substrate materials, other reactive resins or another type of exposure as well. The type of component to be encapsulated, i.e., the component structures to be encapsulated, also determine the geometric dimension of the encapsulation, which can be widely varied.

What is claimed is:

1. A method of encapsulating a component structure, comprising the following steps performed in order:
    applying a first reactive resin layer to a surface of a component substrate containing the component structure, the first reactive resin layer comprising a light-sensitive fluid;
    exposing and developing the first reactive resin layer so as to form a frame structure that encloses the component structure;
    covering the frame structure with an auxiliary foil;
    applying a second reactive resin layer comprising a fluid to a surface of the auxiliary foil so as to form ceiling structures on the surface of the auxiliary foil, at least one of the ceiling structures making a seal with the frame structure;
    causing the second reactive resin layer to harden;
    removing the auxiliary foil only in areas between ceiling structures.

2. A method according to claim 1, wherein applying the second reactive resin layer comprises:
    spin-coating the second reactive resin layer onto an entire surface of the auxiliary foil, the second reactive resin layer comprising a light-sensitive fluid; and
    exposing and developing the second reactive resin layer so as to form the ceiling structures, at least one of the ceiling structures forming a cavity with the frame structure.

3. A method according to claim 2, wherein exposing at least one of the first reactive resin layer and the second reactive resin layer is performed using a laser.

4. A method according to claim 2, wherein developing at least one of exposed first and second reactive resin layers is performed using a fluid developer.

5. A method according to claim 1, wherein the second reactive resin layer is applied in a structured manner to the surface of the auxiliary foil by directly printing ceiling structures onto the surface of the auxiliary foil.

6. A method according to claim 1, wherein the ceiling structures are formed and then cured using one of a screen and stencil printing process.

7. A method according to claim 1, wherein the auxiliary foil comprises thin plastic.

8. A method according to claim 1, further comprising fixing the auxiliary foil to the frame structure using at least one of an adhering process and a fusing process.

9. A method according to claim 1, wherein removing is performed using an incineration treatment and plasma.

10. A method according to claim 1, wherein removing is performed using a solvent.

11. A method according to claim 1, further comprising forming damping structures on the component substrate during exposing and developing.

12. A method according to claim 1, wherein the auxiliary foil comprises at least one of polyamide, PET and polycarbonate and has a thickness of 0.5 to 5 $\mu$m.

13. A method according to claim 1, wherein the first and second reactive resin layers comprise a UV-cured epoxy resin.

14. A method of encapsulating a wafer, comprising the following steps performed in order:
    applying a first reactive resin layer to a surface of the wafer, the first reactive resin layer comprising a light-sensitive fluid;
    exposing and developing the first reactive resin layer so as to form a frame structure that encloses the wafer;
    covering the frame structure with an auxiliary foil, the auxiliary foil comprising a thin plastic;
    applying a second reactive resin layer comprising a fluid to a surface of the auxiliary foil so as to form ceiling structures on the surface of the auxiliary foil, at least one of the ceiling structures making a seal with the frame structure;
    hardening the second reactive resin layer; and
    removing the auxiliary foil only in areas between ceiling structures.

15. A method according to claim 14, wherein applying the second reactive resin layer comprises:
    spin-coating the second reactive resin layer onto an entire surface of the auxiliary foil, the second reactive resin layer comprising a light-sensitive fluid; and
    exposing and developing the second reactive resin layer so as to form the ceiling structures, at least one of the ceiling structures forming a cavity with the frame structure.

16. A method according to claim 14, wherein the ceiling structures are formed and then cured using one of a screen and stencil printing process.

* * * * *